United States Patent [19]
Isogai

[11] Patent Number: 5,563,429
[45] Date of Patent: Oct. 8, 1996

[54] SOLID STATE IMAGING DEVICE

[75] Inventor: Tadao Isogai, Kanagawa, Japan

[73] Assignee: Nikon Corp., Tokyo, Japan

[21] Appl. No.: 261,135

[22] Filed: Jun. 14, 1994

[51] Int. Cl.[6] .......................... H01L 27/14; H01L 29/80; H01L 29/78
[52] U.S. Cl. ............................................ 257/258; 257/292
[58] Field of Search .................................. 257/257, 258, 257/291, 292, 136

[56] References Cited

U.S. PATENT DOCUMENTS

| | | | |
|---|---|---|---|
| 3,453,507 | 7/1969 | Archer | 257/258 |
| 4,155,094 | 5/1979 | Ohba et al. | 257/292 |
| 4,407,010 | 9/1983 | Baji et al. | 257/292 |
| 4,611,221 | 9/1986 | Imai et al. | 257/258 |
| 5,043,783 | 8/1991 | Matsumoto et al. | 257/257 |
| 5,471,515 | 11/1995 | Fossum et al. | 257/292 |

FOREIGN PATENT DOCUMENTS

| | | | |
|---|---|---|---|
| 2-89368 | 3/1990 | Japan | 257/292 |
| 4-137762 | 5/1992 | Japan | 257/258 |
| 4-313949 | 11/1992 | Japan . | |
| 5-235317 | 9/1993 | Japan . | |
| 5-275670 | 10/1993 | Japan . | |

Primary Examiner—Gene M. Munson
Attorney, Agent, or Firm—Keck, Mahin & Cate

[57] ABSTRACT

An amplification-type solid state imaging device includes a plurality of photoelectric conversion devices each adapted to receive incident light to produce a signal charge and a plurality of signal reading devices to read a signal charge produced from one of the photoelectric conversion devices. The photoelectric conversion device includes a photodiode and the signal reading device includes an amplifying transistor for amplifying the signal charge so that the signal charge generated by the photodiode is transferred to the amplifying transistor by one of a plurality of transfer devices.

12 Claims, 2 Drawing Sheets

SOLID STATE IMAGING DEVICE

BACKGROUND OF THE INVENTION

1. Field of the Invention

The present invention relates to an amplification-type solid state imaging device.

2. Related Background Art

Conventional solid state imaging devices are roughly clasified into the CCD-type solid state imaging devices end the amplification-type imaging devices. In the CCD-type imaging device each unit picture element is comprised of a buried photodiode (hereinafter simply referred to as a BPD) serving as a photoelectric conversion device for converting the incident light to a signal charge and a transfer device for transferring the signal charge for reading. The BPD is in the form of a structure in which a shallow diffused region of the opposite conductivity type (i.e., the N-type in the case of the P-type photodiode and the P-type in the case of the N-type photodiode) is formed on a P-N junction region.

On the other hand, in the amplification-type solid state imaging device each picture element is comprised of a transistor such as a MOS-type static induction transistor (hereinafter simply referred to as a MOS-SIT), a junction-type field effect transistor (hereinafter simply referred to as a JFET) or a bipolar transistor and a photoelectric conversion device is composed of a MOS diode or a P-N junction diode forming a part of the component elements of the corresponding transistor. However, the above-mentioned conventional solid state imaging devices have the following disadvantages:

Firstly, the CCD-type imaging device has the disadvantage of being low in sensitivity as compared with the amplification-type imaging device due to the fact that the signal charges are transferred without amplification separately with respect to the individual picture elements, although the device involves the following merits owing to the use of the buried photodiodes for the photoelectric conversion devices:

(a) the quantum efficiency is high;

(b) there is less occurrence of persistence; and (c) there is the less dark current and hence there is the less fixed pattern noise (hereinafter referred to as an FPN) caused by variations of the dark current.

On the other hand, in the amplification-type imaging device the photoelectric conversion is effected by the diode forming a part of the components of each amplification-type transistor and thus it is impossible to obtain such excellent photoelectric conversion characteristic as that of the CCD-type imaging device employing the buried photodiodes for photoelectric conversion. For instance, the M0S diode has the disadvantage of not only deteriorating the quantum efficiency but also increasing the surface leak current due to the low light transmittance of the polysilicon layer forming the gate electrode and there is the problem of increasing the FPN. Also, the P-N junction diode is subject to the occurrence of persistence dye to the incompleteness of its resetting operation. To decrease the density of the photodiode region in an attempt to realize a complete resetting operation rather gives rise to an inconvenience of increasing the surface leak current.

SUMMARY OFT HE INVENTION

The present invention has been made in view of the foregoing circumstances and it is the primary object of the invention to provide a solid state imaging device which is high in quantum efficiency and low in persistence and FPN and which is also high in sensitivity.

In accordance with the present invention there is thus provided a solid state imaging device including photoelectric conversion devices for receiving incident light to generate signal charges and signal reading devices for reading the signal charges produced by the photoelectric conversion devices and, in order to accomplish the previously mentioned object, the imaging device is so designed that the photo-electric conversion devices each includes a photodiode, that the signal reading devices each includes an amplifying transistor for amplifying the signal charge, and that there is provided a plurality of transfer devices each adapted to transfer a signal charge from one of said photodiodes to one of said amplifying transistors.

In accordance with the present invention, it is desirable that the photodiode included in each photoelectric conversion device is specifically a buried photodiode. With the solid state imaging device of the present invention, instead of effecting the photoelectric conversion by the diode constituting a part of the components of the amplification-type transistor, the photoelectric conversion device includes the exclusive photodiode (preferably a buried photodiode) and the photoelectric conversion is effected by this photodiode.

Then, the signal charge produced by the photodiode is sent to the amplifying transistor included in the signal reading device.

BRIEF DESCRIPTION OF THE DRAWINGS

FIG. 1b is a sectional view taken along the line A–A' of the solid state imaging device in FIG. 1a.

FIG. 2b is a sectional view taken along the line A–A' of the solid state imaging device in FIG. 2a.

DETAILED DESCRIPTION OF TEE PREFERRED EMBODIMENTS

A solid state imaging device according to a first embodiment of the present invention will now be described with reference to FIGS. 1a and 1b. Note that in FIG. 1a the aluminum film layer 13 shown in FIG. 1b is not shown for purposes of simplification and the respective regions of the lower layers than the source electrode 8 below the aluminum film layer 13 are shown by solid lines.

Figure 1A:
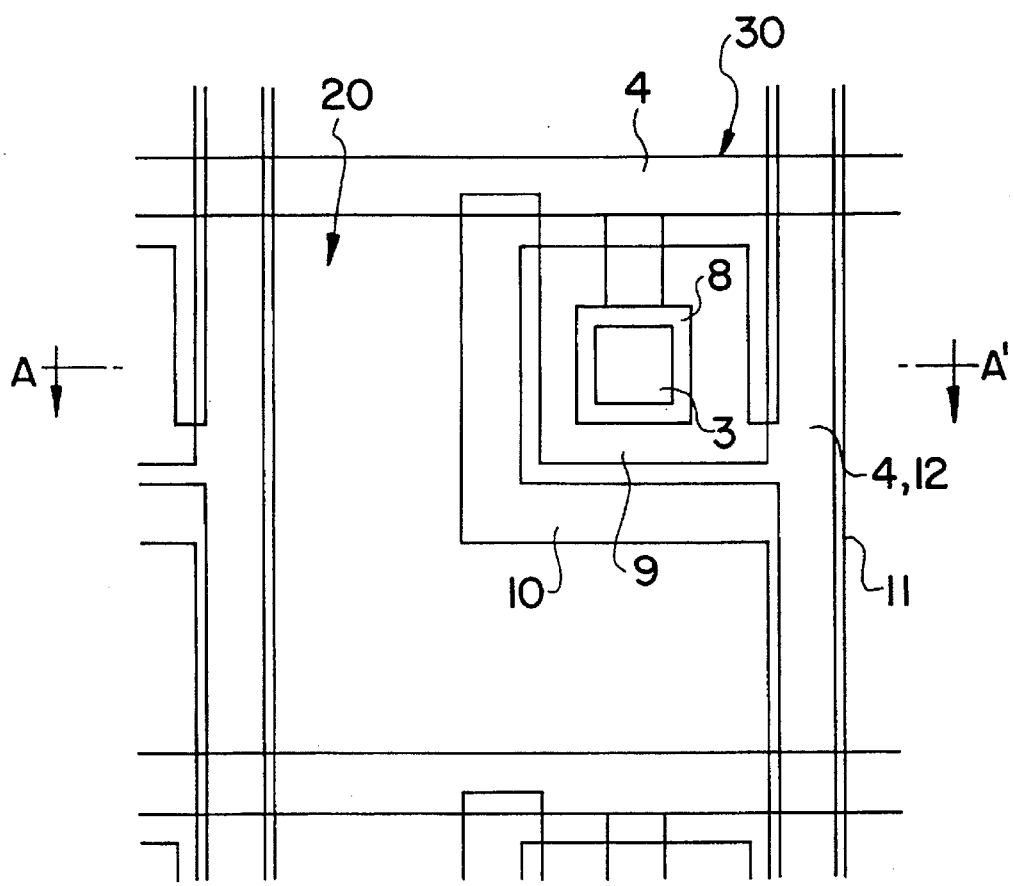
FIG. 1a is a schematic plan view for a unit picture element of a solid state imaging device according to a first embodiment of the present invention.
Figure 1B:
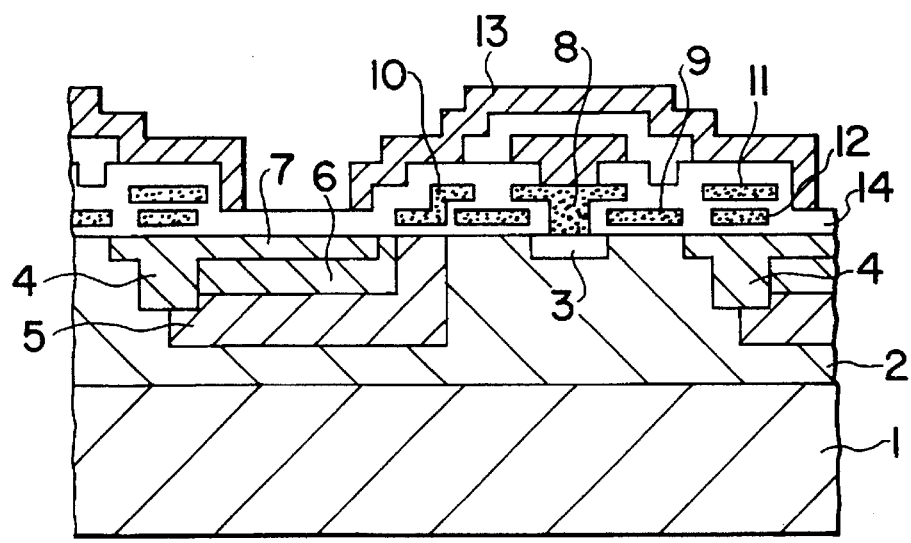

Firstly, in FIG. 1a each of the unit picture elements of the solid state imaging device is composed of a photoelectric conversion portion 20 including a buried photodiode, a transfer gate 10 and a signal reading portion 30 including a MOS-SIT. The photoelectric conversion portion arranged in an L-shaped form is linked with the square-shaped signal reading portion 30 via the transfer gate 10.

Next, the sectional structure of the unit picture element will be explained with reference to FIG. 1b. In the Figure, an N-type semiconductor layer 2 is formed on a P-type substrate 1 and an N-type source region 3 and an N-type drain region 4 are formed in the vicinity of the surface of the N-type semiconductor layer 2. As shown in FIG. 1a, on the outer side of the N-type source region 3, the N-type drain region 4 is formed to surround the picture element and it is connected to an N-type diffused region 7 of a photodiode which will be described later. Also, a source electrode 8 composed of polysilicon is disposed on the N-type source region 3.

A gate electrode 9 is disposed through an insulator layer 14 on the region between the N-type source region 3 and the N-type drain region 4 so as to sourround the N-type source region 3, and a gate line 12 and a transfer gate line 11 are disposed so as to be placed on the N-type drain 4 through the insulator layer 14.

The above-mentioned N-type source region 3, the gate electrode 9 and the N-type drain region 4 form a MOS-SIT. In the present embodiment, the MOS-SIT is provided exclusively for signal charge amplifying purposes and therefore the top layer of the signal reading portion 30 is covered with the light-shielding aluminum film 13 to prevent the production of any charge by the incidence of light on the MOS-SIT.

On the other hand, formed in the N-type semiconductor layer 2 of the photoelectric conversion portion 20 are an N-type well region 5, a P-type photodiode region 6 and a shallow N-type diffused region 7 in this order from the below, and an NPNNP-type buried photodiode is constructed by the vertical structure including the M-type diffused region 7, the P-type photodiode region 6, the N-type well region 5, the N-type layer 2 and the P-type substrate 1.

The transfer gate 10, which connects the photoelectric conversion portion 20 and the signal reading portion 30, is disposed between the P-type photodiode region 5 of the buried photodiode and the gate electrode 9 of the MOS-SIT so as to extend over them through the insulator layer 14 and it functions to transfer the charge stored in the photodiode to below the gate electrode 9 of the MOS-SIT.

The operation of the above-described solid state imaging device of FIG. 1 is as follows.

Firstly, the incident light received by the photo-electric conversion portion 20 for a given time is subjected to photoelectric conversion by the buried photodiode and the generated charge is stored in the photodiode region 6. Thereafter, a pulse voltage is applied to the transfer electrode 10 so that the stored charge is transferred below the gate electrode 9 of the MOS-SIT. In this case, after the charge has been transferred, there is no charge left in the photodiode region 6 and there is no danger of the occurrence of persistence.

Then, a pulse voltage is applied to the gate electrode 9 so that the MOS-SIT is brought into operation and an amplified signal is obtained on the source electrode 8 according to the transferred charge. At this time, the reading of the signal is effected in a nondestructive manner (even if the signal is read from the source electrode 8, the charge transferred to below the gate electrode 9 remains as such) so that a reset pulse voltage is first applied to the gate electrode 9 to discharge the charge and then the next charge transfer operation is started. At this time, after the charge has been transferred to below the gate electrode 9 from the photodiode region 6, no charge remains at all in the photodiode region 6 and there is no occurrence of persistence.

Sit is to be noted that while the M0S-IT is used as an amplifying transistor in the above-described embodiment, as for example, any other transistor such as a bipolar transistor may be used. Where a bipolar transistor is used, it is only necessary to construct the device so that the charge generated by the photodiode is transferred to the base electrode of the bipolar transistor.

Also, while the photodiode included in the photoelectric conversion region should preferably be a buried photodiode from such standpoints as reducing the FPN, the invention is not necessarily limited to the buried type and it is possible to use a photodiode which does not have the N-type diffused region 7 of FIG. 1b.

From the foregoing it will be seen that by virtue of its construction in which the photoelectric conversion portion includes the photodiode and the generated charge is transferred to the amplifying transistor of the signal reading portion, the present embodiment has excellent characteristics, i.e., the high quantum efficiency and the reduction in the FPN due to the dark current. Also, due to the fact that after the transfer of the charge from the photodiode to the amplifying transistor no charge remains in the photodiode thus making the complete transfer possible, the occurrence of persistence is reduced extremely. Further, the transferred charge is read out after it has been amplified by the amplifying transistor of each of the individual picture elements and therefore a high sensitivity is ensured.

Then, in the above-described solid state imaging device of the first embodiment, the photoelectric conversion portions are each composed of the BPD and therefore there are the following advantages over the MOS diodes.

(a) The quantum efficiency is high;

(b) The dark current is reduced with the resulting reduction in the fixed pattern noise due to variations in the characteristics among the individual photoelectric conversion portions;

(c) The occurrence of persistence encountered in the ordinary P-N junctions is eliminated and moreover the sensitivity is enhanced due to the reading of the generated signal charge after its amplification by the MOS-SIT.

Further, since the reading of the signal by the MOS-SIT is effected in a nondestructive manner, the reading operation can be performed many tames so far as no resetting operation is effected.

As an example of attempts for the positive utilization of this characteristic, Japanese Laid-Open Patent Application No. 4-313949 has proposed a technique entitled as a high dynamic range imaging device which is designed so that the nondestructive reading is utilized to optimize the effective storage time for each picture element and thereby to increase the dynamic range of the solid state imaging device.

However, any attempt to apply the solid state imaging device of the first embodiment (FIG. 1) to such high dynamic range producing techniques as mentioned above gives rise to a problem that in spite of the excellent characteristic of the BPD of the photoelectric conversion portion, the fixed pattern noise is increased due to the increased dark current of the signal charge amplifying MOS-SIT.

This is due to the fact that in order to repeatedly effect the nondestructive reading at intervals of the given time, each time a charge is stored in the BPD, the charge is transferred in regular sequence to the MOS-SIT to perform the reading operation and the signal charge is maintained until the MOS-SIT is eventually reset, thereby causing the dark current of the MOS-SIT itself to be added to the signal charge.

In accordance with a second embodiment which will be described hereunder, there is provided a solid state imaging device in which, with a view to overcoming the foregoing problem, the dark current of each amplifying transistor itself is reduced such that fixed pattern noise is reduced even if the nondestructive reading is effected repeatedly at intervals of a given time.

Figure 2A:
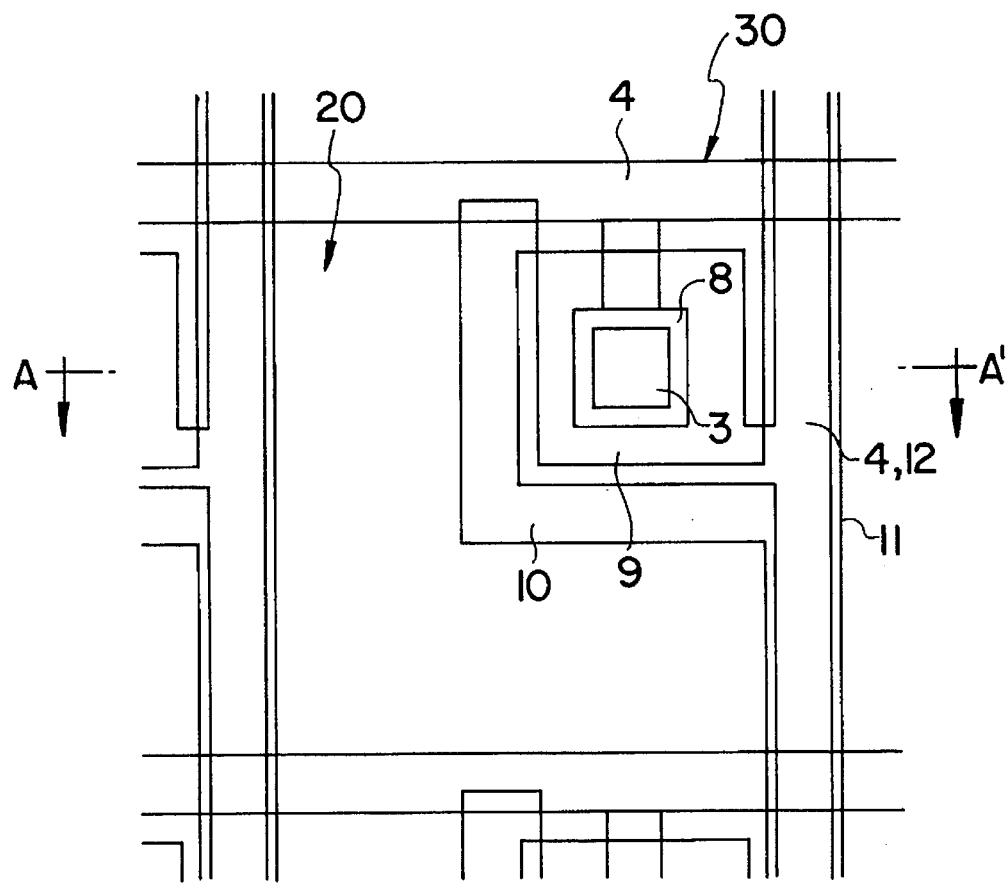
FIG. 2a is a schematic plan view of a solid state imaging device according to a second embodiment of the present invention.
Figure 2B:
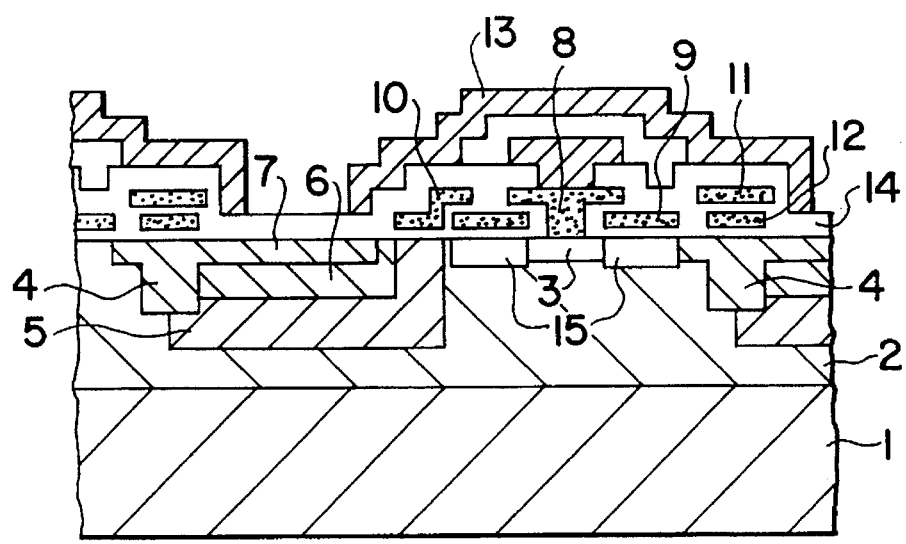

FIG. 2a shows a schematic plan view of the solid state imaging device according to the second embodiment of the present invention and FIG. 2b shows a sectional view taken along the line A–A' of the solid state imaging device in FIG. 2a. In FIG. 2a, for purposes of simplification, the illustration of an aluminum film layer 13 shown in FIG. 2b is omitted and the respective regions of the lower layers than a source electrode 8 below the aluminum film layer 13 are shown by solid lines.

Firstly, in FIG. 2a the unit picture elements of the solid state imaging device are each comprised of a photo-electric conversion portion 20 including a buried photodiode, a transfer gate 10, and a signal reading portion 30 including a junction-type field effect transistor, and the photoelectric conversion portion 20 formed into an L shape is linked with the square-shaped signal reading portion 30 via the transfer gate 10.

The sectional construction of the unit picture element will now be described with reference to FIG. 2b. In the Figure, an N-type semiconductor layer 2 is formed on a P-type substrate 1, and an N-type source region 3 and an N-type drain region 4 are formed in the vicinity of the surface of the N-type semiconductor layer 2. As shown in FIG. 2a, the N-type drain region 4 is formed on the outside of the N-type source region 3 so as to surround the unit picture element and it is connected to an N-type diffused region 7 of a photodiode which will be described later. Also, a source electrode 8 made of polysilicon is formed on the N-type source region 3.

Formed on the region between the N-type source region 3 and the N-type drain region 4 through an insulator layer 14 is a gate electrode 9 disposed to surround the N-type source region 3, and a gate line 12 and a transfer gate line 11 are disposed so as to be placed above the N-type drain region 4 through the insulator layer 14.

The foregoing is the same with the construction of the solid state imaging device of the first embodiment shown in FIG. 1. In the present embodiment, a P-type gate region 15 is disposed below the gate electrode 9. The insulator layer 14 is arranged to interpose between the gate electrode 9 and the P-type gate region 15.

The above-mentioned N-type source region 3, the gate electrode 9, the N-type drain region 4 and the P-type gate region 15 form a JFET. Since this JFET is provided for exclusive signal charge amplifying purpose, the top layer of the signal reading portion 30 is covered with the light-shielding aluminum film 13.

On the other hand, formed in the N-type layer 2 of the photoelectric conversion portion 20 are an N-type well region 5, a P-type photodiode region 6 and the shallow N-type diffused region 7 in this order from below, and an NPNNP-type buried photodiode is constructed by the vertical structure including the N-type diffused region 7, the P-type photodiode region 6, the N-type well region 5, the N-type layer 2 and the P-type substrate 1.

The transfer gate 10, which connects the photoelectric conversion portion 20 and the signal reading portion 30, is disposed between the P-type photodiode region 6 of the buried photodiode and the gate electrode 9 of the JFET so as to extend over them through the insulator layer 14 and it functions to transfer the charge stored in the photodiode to below the gate electrode 9 of the JFET.

The operation of the solid state imaging device of the second embodiment shown in FIG. 2 is as follows.

Firstly, the incident light received by the photo-electric conversion portion for a given period of time is subjected to photoelectric conversion by the buried photo-diode and the generated charge is stored in the photodiode region 6. Thereafter, a pulse voltage is applied to the transfer gate electrode 10 so that the stored charge is transferred to below the gate electrode 9 of the JFET. After the charge has been transferred, no charge remains at all an the photodiode region 6 and there is no occurrence of persistence.

Then, a pulse voltage is applied to the gate electrode 9 so that the JFET is brought into operation and an amplified signal is generated from the source electrode 8 in accordance with the transferred charge. At this time, the reading of the signal is effected in a nondestructive manner (even if the signal is read from the source electrode 8, the charge transferred to below the gate electrode 9 remains as such) so that a resetting pulse voltage is first applied to the gate electrode 9 to discharge the charge and then the next charge transfer operation is started. At this time, after the charge has been transferred from the photodiode region 6 to below the gate electrode 9, no charge remains at all in the photodiode region 6 and the occurrence of persistence is prevented.

On the other hand, while the photodiode included in the photoelectric conversion region should preferably be a buried photodiode from the standpoint of reducing the FPN, etc., the present invention is not necessarily limited to the buried type and it is possible to use a photodiode of the type which does not include the N-type diffused region 7 of FIG. 2b.

From the foregoing it will be seen that in accordance with the present embodiment, by virtue of the construction in which the photoelectric conversion portions each includes the photodiode and the generated charge ks transferred to the amplifying transistor of the signal reading portion, there are excellent characteristic properties that the quantum efficiency is enhanced and that the FPN caused by the dark current is reduced. Also, after the charge has been transferred to the amplifying transistor from the photodiode, no charge remains in the photodiode and the complete transfer is made possible, thus extremely reducing the occurrence of persistence. Further, the transferred charge is read out after it has been amplified by the amplifying transistor of each of the individual unit picture elements and therefore the enhanced sensitivity is ensured.

In accordance with the solid state imaging device of the present embodiment, owing to the fact that the junction-type field effect transistor is used for each of the amplifying transistors for signal charge amplifying purposes, it is possible to prevent the depletion of charge carriers in the silicon (Si) surface below the gate electrode and thereby to reduce the dark current. The reason resides in the fact that since the channel region and the high-density diffused layer (forming the gate region) of the reverse conductivity type are formed in the Si surface below the gate electrode in the JFET, even if the P-N junction formed by the gate region and the channel region is reverse biased, it is possible to prevent the spreading of the depletion layer to the surface of the gate region.

From the foregoing description it will be seen that in the solid state imaging device of this embodiment the dark current is reduced so that the occurrence of FPN is reduced even if the nondestructive reading is repeatedly performed at intervals of a given time.

What is claimed is:

1. A solid state imaging device including a plurality of picture elements provided on a semiconductor substrate, each of said picture elements comprising:

a photoelectric conversion device including a photodiode for photoelectrically converting received incident light to produce a signal charge and for storing said signal charge therein;

a junction-type field effect transistor adapted to amplify said signal charge from said photodiode, said transistor including a source region of a first conductivity type, a drain region of said first conductivity type, a gate region of a second conductivity type disposed between said source region and said drain region, a gate electrode disposed over and isolated from said gate region with an isolator film layer lying between said gate region and said gate electrode; and a transfer device adapted to control electrical connection between said photoelectric conversion device and said transistor so that said electrical connection alternates between a state of cutoff and a state of conduction and said signal charge stored in said photodiode is transferred to said transistor when said electrical connection is in said state of conduction.

2. A solid state imaging device according to claim 1, wherein said photodiode is formed as a buried photodiode having a diffused region provided over a portion of a P-N junction region of said photodiode, said diffused region being of a conductivity type opposite to a conductivity type of said photodiode.

3. A solid state imaging device according to claim 1, wherein said transfer device includes a transfer electrode disposed between and isolated from both said photoelectric conversion device and said transistor with an isolator film layer disposed below said transfer electrode.

4. A solid state imaging device according to claim 3, wherein said transfer electrode is disposed over a part of said gate region and over a part of said photoelectric conversion device, and wherein said transfer electrode is isolated from said part of said gate region and from said part of said photoelectric conversion device by said isolator film layer.

5. A solid state imaging device according to claim 1, wherein each of said picture elements further comprises a light-shielding film overlying a portion of said transistor to prevent the incidence of light into said transistor and an isolator film lying between said light-shielding film and said portion.

6. A solid state imaging device according to claim 1, wherein said photodiode is formed as a buried photodiode including a well region of a first conductivity type, a photodiode region of a second conductivity type disposed on said well region, and a diffused region of said first conductivity type provided on said photodiode region, said first conductivity type and said second conductivity type being opposite in conductivity to each other.

7. A solid state imaging device including a plurality of picture elements provided on a semiconductor substrate, each of said picture elements comprising:

a photoelectric conversion device including a buried photodiode for photoelectrically converting received incident light to produce a signal charge and for storing said signal charge therein, said photodiode being composed of an NPN-type vertical structure including an N-type well region, a P-type photodiode region which is disposed on said N-type well region and an N-type diffused region which is disposed on said photodiode region;

a junction-type field effect transistor adapted to amplify said signal charge from said photodiode, said transistor including an N-type source region, an N-type drain region, a P-type gate region disposed between said source region and said drain region, a gate electrode disposed over and isolated from said gate region with an isolator film layer lying between said gate region and said gate electrode; and a transfer device adapted to control electrical connection between said photoelectric conversion device and said transistor so that said electrical connection alternates between a state of cutoff and a state of conduction and said signal charge stored in said photodiode is transferred to said gate region of said transistor when said connection is in said state of conduction.

8. A solid state imaging device according to claim 7, wherein said transfer device includes a transfer electrode disposed between and isolated from both said photoelectric conversion device and said transistor with an isolator film layer disposed below said transfer electrode.

9. A solid state imaging device according to claim 8, wherein said transfer electrode is disposed over a part of said gate region and over a part of said photoelectric conversion device, and wherein said transfer electrode is isolated from said part of said gate region and from said part of said photoelectric conversion device by said isolator film layer.

10. A solid state imaging device including a plurality of picture elements provided on a P-type semiconductor substrate, each of said picture elements comprising:

a photoelectric conversion device including a buried photodiode for photoelectrically converting received incident light to produce a signal charge and for storing said signal charge therein, said photodiode being composed of an NPNNP-type vertical structure including said P-type semiconductor substrate, an N-type diffused layer which is disposed on said semiconductor substrate, an N-type well region which is provided on said N-type diffused layer, a P-type photodiode region which is disposed on said N-type well region and an N-type diffused region which is disposed on said photodiode region;

a junction-type field effect transistor adapted to amplify said signal charge from said photodiode, said transistor being composed of a structure including an N-type source region disposed in said N-type diffused layer, an N-type drain region disposed in said N-type diffused layer, a P-type gate region disposed between said source region and said drain region within said N-type diffused layer, a gate electrode disposed over and isolated from said gate region with an isolator film layer lying between said gate region and said gate electrode; and a transfer device adapted to control electrical connection between said photoelectric conversion device and said transistor so that said electrical connection alternates between a state of cutoff and a state of conduction and said signal charge stored in said photodiode is transferred to said gate region of said transistor when said connection is in said state of conduction, said transfer device including a transfer electrode disposed between and isolated from both said photoelectric conversion device and said transistor with an isolator film layer disposed below said transfer electrode.

11. A solid state imaging device according to claim 10, wherein said transfer electrode is disposed over a part of said gate region and over a part of said photoelectric conversion device, and wherein said transfer electrode is isolated from said part of said gate region and from said part of said photoelectric conversion device by said isolator film layer.

12. A solid state imaging device according to claim 11, wherein each of said picture elements further comprises a light-shielding film overlying a portion of said transistor to prevent the incidence of light into said transistor and an isolator film lying between said light-shielding film and said portion.

* * * * *